United States Patent
Huang et al.

(10) Patent No.: US 12,306,244 B2
(45) Date of Patent: May 20, 2025

(54) TEST CIRCUIT IN CHIP AND CIRCUIT TEST METHOD

(71) Applicant: HUAWEI TECHNOLOGIES CO., LTD., Guangdong (CN)

(72) Inventors: Yu Huang, Shenzhen (CN); Changming Cui, Shenzhen (CN); Junlin Huang, Shenzhen (CN); Haitao Fu, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 144 days.

(21) Appl. No.: 18/176,025

(22) Filed: Feb. 28, 2023

(65) Prior Publication Data

US 2023/0204661 A1 Jun. 29, 2023

Related U.S. Application Data

(63) Continuation of application No. PCT/CN2020/112609, filed on Aug. 31, 2020.

(51) Int. Cl.
G01R 31/317 (2006.01)
G01R 31/3185 (2006.01)

(52) U.S. Cl.
CPC ... *G01R 31/3172* (2013.01); *G01R 31/31722* (2013.01); *G01R 31/318544* (2013.01); *G01R 31/318572* (2013.01)

(58) Field of Classification Search
CPC .......... G01R 31/3172; G01R 31/31722; G01R 31/318544; G01R 31/318572; G01R 31/318558; G01R 31/318563
USPC ....................................................... 324/537
See application file for complete search history.

(56) References Cited

U.S. PATENT DOCUMENTS

| | | | | |
|---|---|---|---|---|
| 6,014,763 | A  * | 1/2000 | Dhong ........... | G01R 31/318572 714/724 |
| 2003/0200493 | A1* | 10/2003 | Campbell ...... | G01R 31/318572 714/726 |
| 2009/0210759 | A1* | 8/2009 | Singhal .................. | G11C 29/32 714/E11.155 |
| 2017/0115346 | A1* | 4/2017 | Sonawane ...... | G01R 31/318555 |
| 2018/0172761 | A1* | 6/2018 | van Beers ...... | G01R 31/318505 |
| 2020/0174070 | A1* | 6/2020 | Schat ............ | G01R 31/318552 |

* cited by examiner

*Primary Examiner* — Christopher P Mcandrew

(57) ABSTRACT

A test circuit transmits input data of a test vector to a data distribution circuit using an input of a test bus, and transmits the input data of the test vector to a scan input channel in a circuit under test using the data distribution circuit. After scan of the circuit under test is completed, output data of the test vector on a scan output channel in the circuit under test is transmitted to an output of the test bus using the data distribution circuit, to complete testing of the circuit under test. A dynamic correspondence between the data distribution circuit and the test bus may be configured based on a specific test solution, so that a test resource can be dynamically allocated.

18 Claims, 11 Drawing Sheets

TEST CIRCUIT IN CHIP AND CIRCUIT TEST METHOD

CROSS-REFERENCE TO RELATED APPLICATIONS

This application is a continuation of International Application No. PCT/CN2020/112609, filed on Aug. 31, 2020, the disclosure of which is hereby incorporated by reference in its entirety.

TECHNICAL FIELD

This application relates to the field of electronic technologies, and in particular, to a integrated circuit (chip) that further comprises a test circuit and an associated test method.

BACKGROUND

With development of semiconductor technologies, a system-on-chip (SoC) is becoming increasingly large in scale, and there are an increasingly large quantity of circuit modules in the system-on-chip. When the circuit module in the system-on-chip is tested, there are limited resources available for testing, for example, there are limited chip pins. Therefore, the limited resources need to be properly planned and reused to meet a requirement of a large-scale test. To resolve the foregoing problem, currently used solutions include a scan routing fabric (SRF) solution and a streaming scan network (SSN) solution. Each of the solutions, however, are limited in the extent to which they can test the important aspects of the SoC.

In the SRF solution, a small quantity of chip pins may be multiplexed by using a multiplexer (MUX), so that a circuit that includes a larger quantity of test scan channels can be tested. If a quantity of scan channels in a circuit that is under test continuously increases, a relatively severe winding congestion problem occurs, and there are high test costs. In the SSN solution, test scan data is transmitted by using a bus, and in a transmission process, the test data is exchanged between the bus and test compression logic of a circuit that is under test by using a relatively complex hardware circuit. When a quantity of circuits under test increases, a quantity of hardware circuits used for data exchange increases, and consequently there is a relatively large hardware circuit scale. In addition, in the SSN solution, the complex hardware circuit further needs to be configured in various aspects, and there is a relatively complex configuration process and low test efficiency.

SUMMARY

Embodiments of this disclosure provide a test circuit in a chip and a circuit test method that optimize problems of winding congestion and complex test configuration in a current test solution, so as to reduce test costs and improve test efficiency.

To achieve the foregoing objective, the following technical solutions are used in this disclosure.

According to a first aspect, a test circuit is provided. The test circuit includes a plurality of test sub-circuits respectively corresponding to a plurality of circuits under test. A $j^{th}$ test sub-circuit in the plurality of test sub-circuits includes $N_j$ data distribution circuits, and the $N_j$ data distribution circuits are configured to connect a corresponding circuit under test to a test bus. Each circuit under test corresponds to one test sub-circuit, and each test sub-circuit may transmit data required for test scan to a scan input channel in a corresponding circuit under test by using the test bus, and transmit test result data of the corresponding circuit under test to an output of the test bus. The data distribution circuit is configured to: receive scan test data from the test bus, transmit the scan test data to a scan input channel in the circuit under test, receive test result data from a scan output channel in the circuit under test, and transmit the test result data to the output of the test bus. In the $j^{th}$ test sub-circuit, the $j^{th}$ test sub-circuit may be any one of the plurality of test sub-circuits, and a quantity $N_j$ of data distribution circuits in the $j^{th}$ test sub-circuit is a quantity of scan channels in the corresponding circuit under test, that is, is a maximum value in a quantity $CI_j$ of scan input channels and a quantity $CO_j$ of scan output channels in the corresponding circuit under test, that is, $N_j = \max(CI_j, CO_j)$. First input terminals of the $N_j$ data distribution circuits are respectively connected to $N_j$ inputs of the test bus, that is, the first input terminal of the data distribution circuit is configured to receive the test scan data from the test bus. Output terminals of $CI_j$ data distribution circuits in the $N_j$ data distribution circuits are respectively connected to $CI_j$ scan input channels in the circuit under test corresponding to the test sub-circuit, that is, the first output terminal of the data distribution circuit is configured to transmit the test scan data received from the test bus to the scan input channel in the corresponding circuit under test. Second input terminals of $CO_j$ data distribution circuits in the $N_j$ data distribution circuits are respectively connected to $CO_j$ scan output channels in the circuit under test corresponding to the test sub-circuit, and output terminals of the $N_j$ data distribution circuits are further connected to $N_j$ outputs of the test bus, that is, the second input terminal of the data distribution circuit is configured to receive the test result data output by the scan output channel in the corresponding circuit under test, and the test result data is output to the test bus by using the second output terminal of the data distribution circuit.

Based on the test circuit provided in the first aspect, the test circuit may transmit a test vector, namely, test excitation data, on the input of the test bus to the scan input channel in the circuit under test by using the data distribution circuit, and after scan is completed, transmit the test result data on the scan output channel in the circuit under test to the output of the test bus by using the data distribution circuit, to complete testing of the circuit under test. During circuit testing, different circuits under test may be allocated to different test buses for testing by using the data distribution circuit in the test circuit, so that the test bus can be dynamically allocated by using the data distribution circuit based on a specific test solution. In the test circuit provided in the first aspect, a line congestion problem can be optimized to a great extent, to reduce test costs, and a configuration process can be simplified to improve test efficiency.

In a possible implementation of the first aspect, the data distribution circuit may include a first selector and a first register. The first selector is configured to enable the data distribution circuit to select whether to receive data from the test bus or receive data from the scan output channel in the corresponding circuit under test. That is, a first input terminal of the first selector is used as the first input terminal of the data distribution circuit, and a second input terminal of the first selector is used as the second input terminal of the data distribution circuit. The register is configured to temporarily store data received by the data distribution circuit. Therefore, an input terminal of the first register is connected to an output terminal of the first selector, and an output terminal of the first register is used as the output terminal of the data distribution circuit. In the possible implementation, the data distribution circuit has two inputs, which respectively receive the test scan data from the test bus and receive test output data from the scan output channel in the corresponding circuit under test. The data distribution circuit selects an input by using configuration of the first selector, so that the test scan data and the test output data are respectively transmitted on the test bus in different time periods. There is a simple circuit structure, and a data transmission conflict can be avoided, and therefore circuit test efficiency is improved.

Further, the data distribution circuit may further include a data distributor and a second selector. The data distributor and the second selector are configured to control whether the output of the data distribution circuit passes through the first register. That is, an input terminal of the data distributor is connected to the output terminal of the first selector, a first output terminal of the data distributor is connected to the input terminal of the first register, a first input terminal of the second selector is connected to the output terminal of the first register, a second input terminal of the second selector is connected to a second output terminal of the data distributor, and an output terminal of the second selector is used as the output terminal of the data distribution circuit. In the possible implementation, the data distribution circuit controls, by using configuration of the data distributor and the second selector, whether the output of the data distribution circuit passes through the first register in the data distribution circuit, so that when the circuit under test corresponding to the test sub-circuit in which the data distribution circuit is located does not participate in testing, the first input terminal and the output terminal of the data distribution circuit do not pass through the first register in the data distribution circuit, to reduce a test time and improve test efficiency.

Optionally, each test sub-circuit may further include a state machine, and the state machine may include: a first state control terminal that is connected to a scan enable terminal of a scan chain of a circuit under test corresponding to the test sub-circuit and that is configured to generate a scan enable signal to control whether test scan is enabled for the scan chain of the circuit under test; and a second state control terminal that is connected to a control terminal of the first selector and that is configured to generate a scan capture enable signal to control whether each data distribution circuit in the test sub-circuit receives scan output data of the circuit under test. The test circuit is configured by using the state machine, to generate the foregoing two signals. In this way, a configuration process can be simplified.

Optionally, each test sub-circuit further includes a configuration circuit, an input terminal of the configuration circuit is connected to the test bus, that is, the configuration circuit is correspondingly configured by using the input of the test bus, and a first output terminal of the configuration circuit is connected to a sleep control terminal of the circuit under test corresponding to the test sub-circuit, and is connected to control terminals of the data distributor and the second selector in the test sub-circuit. In the possible implementation, the first output terminal of the configuration circuit is connected to the sleep control terminal of the circuit under test, and whether the circuit under test is in a test state may be configured by using the configuration circuit, that is, a circuit under test that does not participate in testing is configured to a sleep mode by using a sleep control terminal of the circuit under test, to reduce test power consumption. In addition, whether the data distribution circuit is in a bypass mode may be configured by using the configuration circuit, that is, the first output terminal of the configuration circuit is further connected to the control terminals of the data distributor and the second selector in the data distribution circuit. When the circuit under test does not participate in testing, the data distribution circuit corresponding to the circuit under test is configured to the bypass mode, so that data does not pass through the first register in the data distribution circuit during transmission, to reduce a test time.

Further, an input terminal of a configuration circuit in a first test sub-circuit is connected to the input of the test bus, and an input terminal of a configuration circuit in an $x^{th}$ test sub-circuit is connected to a second output terminal of a configuration circuit in an $(x-1)^{th}$ test sub-circuit, where x is a positive integer greater than or equal to 2. In the possible implementation, in the foregoing connection manner, when a bit width of the test bus is limited, configuration of the sleep control terminal of the circuit under test may be completed only by sequentially transmitting data to the configuration circuit. In this way, a configuration process can be simplified.

Optionally, the test circuit further includes a second register, an input of the second register is connected to the input of the test bus, and an output of the second register is connected to the input terminal of the configuration circuit in the first test sub-circuit. In the possible implementation, the configuration circuit can be configured for data transmission by using the second register, and the second register further has a control function to control whether the configuration circuit latches data. In this way, a circuit structure can be simplified.

Further, the configuration circuit in each test sub-circuit may include a third register and a latch, an input terminal of the third register is used as the input terminal of the configuration circuit, an output terminal of the third register is connected to an input terminal of the latch, an output terminal of the latch is used as the first output terminal of the configuration circuit, and the output terminal of the third register is further used as a second output terminal of the configuration circuit. In the possible implementation, whether each circuit under test is in the sleep mode may be separately configured by using a combination of the third register and the latch, and whether a value in the latch is maintained is controlled by using a control terminal of the latch, to avoid a case in which testing of the circuit under test is affected due to a change in a value at the sleep control terminal of the circuit under test when data from the test bus changes, and to simplify a configuration process and a line.

In a possible implementation of the first aspect, the configuration circuit may further include an AND gate, a first input terminal of the AND gate is connected to the output terminal of the second register, a second input of the AND gate is connected to the second state control terminal of the state machine, and an output terminal of the AND gate is connected to a control terminal of the latch in each configuration circuit. The second state control terminal of the state machine generates a scan capture enable signal to control data capture, for example, capture data in the latch in the configuration circuit in each test sub-circuit and transmit the data to the sleep control terminal of the circuit under test, load the test excitation data in the data distribution circuit to the scan input channel in the circuit under test, or collect data on the scan output channel in the circuit under test and transmit the data to the data distribution circuit. In the possible implementation, whether the latch latches data can be configured by performing an AND operation between the second register and the second state control terminal of the state machine. In this way, a configuration process is further simplified.

In a possible implementation of the first aspect, each test sub-circuit further includes a frequency dividing circuit, and the frequency dividing circuit is connected to a bus clock and a scan clock in the scan chain of the circuit under test corresponding to the test sub-circuit. In the possible implementation, a high-speed scan clock of the test bus is divided into a low-speed scan clock in the circuit under test, to facilitate a scan test of the circuit under test.

According to a second aspect, an integrated circuit is provided. The integrated circuit includes a plurality of circuits under test, a test bus, and the test circuit in any possible implementation of the first aspect. The plurality of circuits under test are connected to the test bus by using a plurality of test sub-circuits corresponding to the circuits under test in the test circuit.

According to a third aspect, an electronic device is provided. The electronic device includes a printed circuit board and the integrated circuit in the second aspect. The integrated circuit is disposed on the printed circuit board.

According to a fourth aspect, a circuit test method is provided. The circuit test method may be used in EDA software, and is applicable to a case in which a circuit under test is tested by using a test circuit. The test circuit is the test circuit in any possible implementation of the first aspect. The circuit test method includes: generating configuration information and a test vector, where the configuration information is used to configure the test circuit, and the test vector is test excitation data of the circuit under test, and is determined based on a circuit structure of the circuit under test.

In a possible implementation of the fourth aspect, the circuit test method may further include: configuring the test circuit based on the configuration information; transmitting the test vector to a test bus, and transmitting the test vector to a scan input channel in the circuit under test by using the test circuit; and transmitting test result data of the circuit under test to an output of the test bus by using the circuit under test.

Further, the configuring the test circuit based on the configuration information may include: grouping all circuits under test based on a grouping rule; and configuring, based on a grouping result, a test sub-circuit corresponding to each circuit under test.

Further, the grouping all circuits under test based on a grouping rule may include: obtaining a quantity of scan channels in each circuit under test and a bit width of the test bus, where the quantity of scan channels in each circuit under test is a maximum value in a quantity of scan input channels and a quantity of scan output channels in each circuit under test; and grouping the circuits under test that are to be tested into a plurality of test groups when a sum of quantities of scan channels in all the circuits under test exceeds the bit width of the test bus, where a quantity of scan channels in a circuit under test included in each test group is less than or equal to the bit width of the test bus.

Optionally, the configuring, based on a grouping result, a test sub-circuit corresponding to each circuit under test includes: connecting all the circuits under test to the test bus by using a data distribution circuit based on the grouping result, determining a correspondence between a scan input channel in the circuit under test and an input of the test bus, and determining a correspondence between a scan output channel in the circuit under test and the output of the test bus, where in a same test group, different scan input channels in the circuit under test correspond to different inputs of the test bus, and different scan output channels in the circuit under test correspond to different outputs of the test bus; configuring a circuit under test that is not to be tested to a sleep mode by using a configuration module in a test sub-circuit corresponding to the circuit under test that is not to be tested; and/or configuring a data distribution circuit in the test sub-circuit corresponding to the circuit under test that is not to be tested to a bypass mode by using the configuration module in the test sub-circuit.

It should be understood that in a same test group, a total quantity of scan channels in all circuits under test does not exceed the bit width of the test bus. Therefore, all the circuits under test in the same test group may be tested in parallel. When the circuits under test are tested in parallel, there is a one-to-one correspondence for the input and the output of the test bus and the data distribution circuit.

Optionally, in a same test group, when structures of two circuits under test are the same, scan input channels at a same position in the two circuits under test are connected to a same data distribution circuit. When circuits under test of an exactly same structure are tested, same test excitation data is required for the circuits under test. Therefore, when the circuits under test of a same structure are tested, the test excitation data may be transmitted to scan input channels at a same position in the circuits under test by using a same data distribution circuit. During output, different data distribution circuits are used for transmission, to distinguish and determine whether the circuit under test is faulty.

Further, the transmitting the test vector to a scan input channel in the circuit under test by using the test circuit includes: transmitting the test vector to the scan input channel in the circuit under test based on the correspondence between the scan input channel in the circuit under test and the input of the test bus by using the input of the test bus corresponding to the scan input channel in the circuit under test.

Optionally, the transmitting test result data of the circuit under test to an output of the test bus by using the circuit under test includes: transmitting, based on the correspondence between the scan output channel in the circuit under test and the output of the test bus, the test result data output by the scan output channel in the circuit under test to the output of the test bus corresponding to the scan output channel in the circuit under test.

Further, the transmitting the test vector to the scan input channel in the circuit under test based on the correspondence between the scan input channel in the circuit under test and the input of the test bus by using the input of the test bus corresponding to the scan input channel in the circuit under test includes: The test bus sequentially transmits, in a plurality of bus clock cycles, the test vector to scan input channels in the circuit under test that is to be tested, where one input of the test bus corresponds to more than one scan input channel in the circuit under test.

It should be noted that when the circuit under test is tested, a plurality of circuits under test may be simultaneously tested. However, the bit width of the test bus is limited. Therefore, the test bus is multiplexed, that is, the test bus transmits data to scan input channels in the plurality of circuits under test in a time division multiplexing manner. In one bus clock cycle, the test bus can transmit data only to one scan input channel. Therefore, if one input of the test bus needs to transmit data to a plurality of scan input channels, transmission is sequentially performed in a plurality of bus clock cycles.

Optionally, the transmitting, based on the correspondence between the scan output channel in the circuit under test and the output of the test bus, the test result data output by the scan output channel in the circuit under test to the output of the test bus corresponding to the scan output channel in the circuit under test includes: The test bus sequentially transmits test result data on scan output channels in the circuit under test to the output of the test bus in a plurality of clock cycles, where one output of the test bus corresponds to more than one scan output channel in the circuit under test. The test result data is transmitted to the test bus. Similarly, the scan test data, namely, the test vector, is transmitted to the scan input channel in the circuit under test. Details are not described herein.

According to a fifth aspect, a test circuit design method is provided. The test circuit design method includes: obtaining a quantity of scan input channels and a quantity of scan output channels in each circuit under test and a bus bit width of a test bus; and configuring, on the test bus based on the bus bit width of the test bus and the quantity of scan input channels and the quantity of scan output channels in each circuit under test, a data distribution circuit in a test sub-circuit corresponding to each circuit under test, to generate the test circuit in any possible implementation of the first aspect, where a quantity of data distribution circuits in the test sub-circuit corresponding to each circuit under test is determined based on the quantity of scan input channels and the quantity of scan output channels in each circuit under test.

It may be understood that any one of the integrated circuit, the electronic device, the test circuit design method, the circuit test method, and the like provided above may be implemented by or associated with the corresponding test circuit provided above. Therefore, for beneficial effects that can be achieved by any one of the integrated circuit, the electronic device, the test circuit design method, the circuit test method, and the like, refer to the beneficial effects in the test circuit provided above. Details are not described herein.

REFERENCE NUMERALS

01: Circuit under test; 02: Test bus; 03: Test circuit; 30: Test sub-circuit; 301: Data distribution circuit; 3011: First selector; 3012: First register; 3013: Data distributor; 3014: Second selector; 302: Configuration circuit; 303: Second register; 3021: Third register; 3022: Latch; 304: State machine; 305: Frequency dividing circuit; and 306: AND gate.

Description of Embodiments

The following describes the technical solutions in embodiments of this disclosure with reference to the accompanying drawings in embodiments of this disclosure. It is clear that the described embodiments are merely a part rather than all of embodiments of this disclosure.

The terms "first" and "second" mentioned below are merely intended for a purpose of description, and shall not be understood as an indication or implication of relative importance or implicit indication of a quantity of indicated technical features. Therefore, a feature limited by "first" or "second" may explicitly indicate or implicitly include one or more such features.

It should be noted that, in embodiments of this disclosure, the term such as "example" or "for example" is used to represent giving an example, an illustration, or descriptions. Any embodiment or design scheme described as an "example" or "for example" in embodiments of this disclosure should not be explained as being more preferred or having more advantages than another embodiment or design scheme. Exactly, use of the word "example", "for example", or the like is intended to present a related concept in a specific manner.

In this disclosure, unless otherwise expressly specified and limited, the term "connection" should be understood in a broad sense. For example, the "connection" may be a physical direct connection, or may be an electrical connection implemented by using an intermediate medium, for example, a connection implemented by using a resistor, an inductor, a capacitor, or another electronic device.

Figure 1:
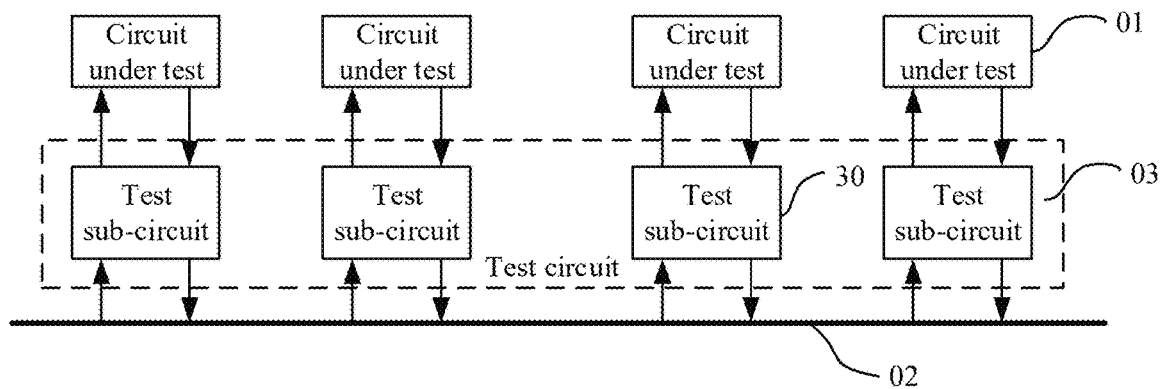
FIG. 1 is a schematic diagram of a structure of an integrated circuit according to an embodiment of this disclosure.

Some embodiments of this disclosure provide a test circuit 03 (shown in FIG. 1). The test circuit 03 is configured to test a plurality of functional modules in an integrated circuit, so that the integrated circuit can perform a predetermined function. Different integrated circuits can implement different functions, and therefore the different integrated circuits include different functional modules. For example, a mobile phone chip includes a processor module, a touchscreen control module, a storage module, a power management module, and the like.

Some embodiments of this disclosure provide an integrated circuit. The integrated circuit includes a plurality of circuits under test 01, a test bus 02, and a test circuit 03. Different circuits under test 01 in each integrated circuit may implement a same function or different functions. The test circuit 03 includes a plurality of test sub-circuits 30 corresponding to the plurality of circuits under test 01, in other words, each circuit under test 01 corresponds to one test sub-circuit 30. The plurality of circuits under test 01 are connected to the test bus 02 by using the plurality of test sub-circuits 30, so that the integrated circuit can perform a functional test on the plurality of circuits under test 01 based on a planned test rule.

An embodiment of this disclosure further provides an electronic device. The electronic device includes a printed circuit board and the integrated circuit shown in FIG. 1. The integrated circuit provided in the foregoing embodiments is disposed on the printed circuit board. The electronic device may be an electronic product such as a mobile phone, a tablet computer (pad), a computer, a smart wearable product (for example, a smart watch or a smart band), a virtual reality (VR) terminal device, or an augmented reality (AR) terminal device. A specific form of the electronic device is not specifically limited in this embodiment of this disclosure.

A test sub-circuit 30 is coupled to each circuit under test 01 to send and receive test related signals as provided in an embodiment of this disclosure and is described below in detail with reference to the accompanying drawings. Each of the test sub-circuit 30 are coupled to communicate bi-directionally over a bus 02 as may be seen in FIG. 1.

Figure 2:
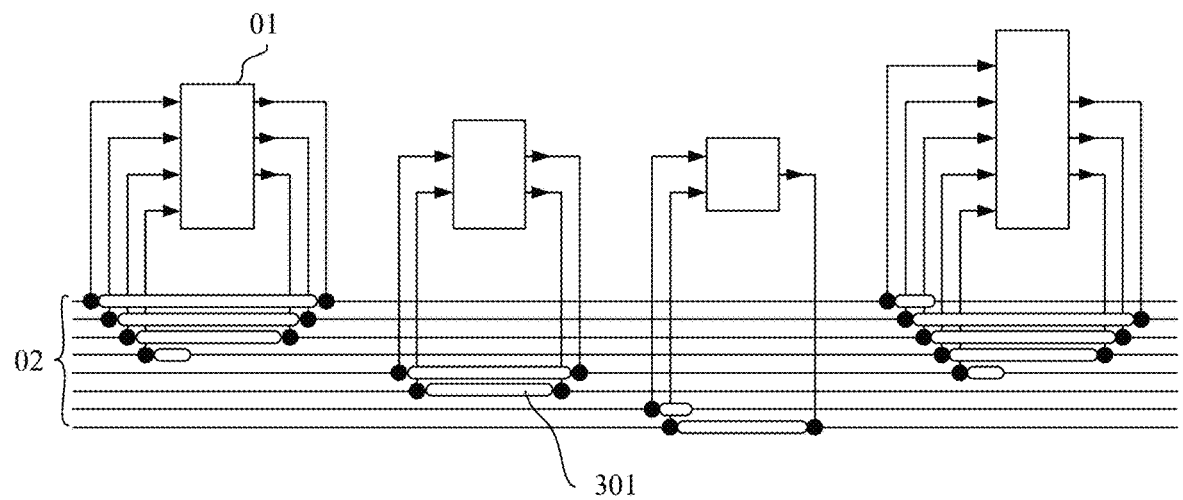
FIG. 2 is a schematic diagram of a connection relationship between a circuit under test and a test bus existing during circuit testing according to an embodiment of this disclosure.

FIG. 2 is a schematic diagram of a connection relationship between a circuit under test 01 and a test bus 02 existing during circuit testing according to an embodiment of this disclosure. One integrated circuit may include a plurality of functional modules that implement different functions or a same function, and all the functional modules need to be tested by using the test circuit 03 of FIG. 1, to know whether functions of the functional modules can be normally performed. In this case, the functional modules may be referred to as circuits under test 01 in a test process. Therefore, the test circuit 03 in this embodiment of this disclosure may include a plurality of test sub-circuits 30 respectively corresponding to the plurality of circuits under test 01. The plurality of test sub-circuits 30 are configured to respectively connect the corresponding circuits under test 01 to the test bus 02. The test bus 02 corresponds to scanbus in FIG. 3 and FIG. 4, scanbus_in is an input channel of the test bus 02, and scanbus_out is an output channel of the test bus 02.

It should be noted that the test sub-circuits 30 are configured to respectively connect the corresponding circuits under test 01 to the test bus. Each test sub-circuit 30 may include a plurality of data distribution circuits 301, and a quantity of data distribution circuits 301 in each test sub-circuit 30 is related to a quantity of scan channels in a circuit under test 01 corresponding to the test sub-circuit 30. For example, in an example shown in FIG. 2, the quantity of data distribution circuits 301 in each test sub-circuit 30 is equal to the quantity of scan channels in the corresponding circuit under test 01, and the quantity of scan channels in the circuit under test 01 is a maximum value in a quantity of scan input channels channel_in and a quantity of scan output channels channel_out in the circuit under test 01. Therefore, as shown in FIG. 2, each test sub-circuit 30 may connect the circuit under test 01 to the test bus 02 by using the plurality of data distribution circuits 301.

Figure 3:
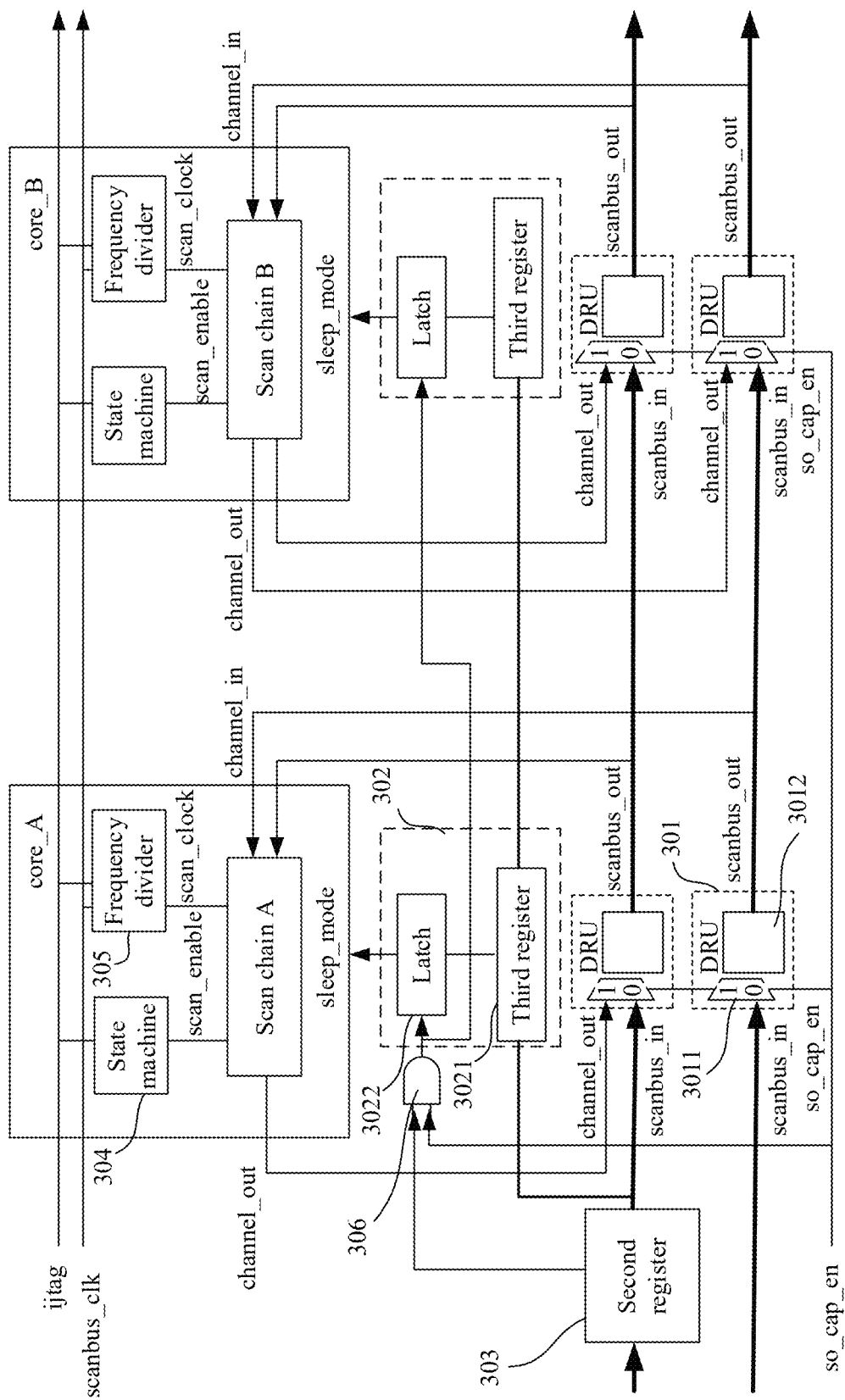
FIG. 3 is a schematic diagram 1 of structures of a circuit under test, a test bus, and a test circuit in FIG. 1.
Figure 4:
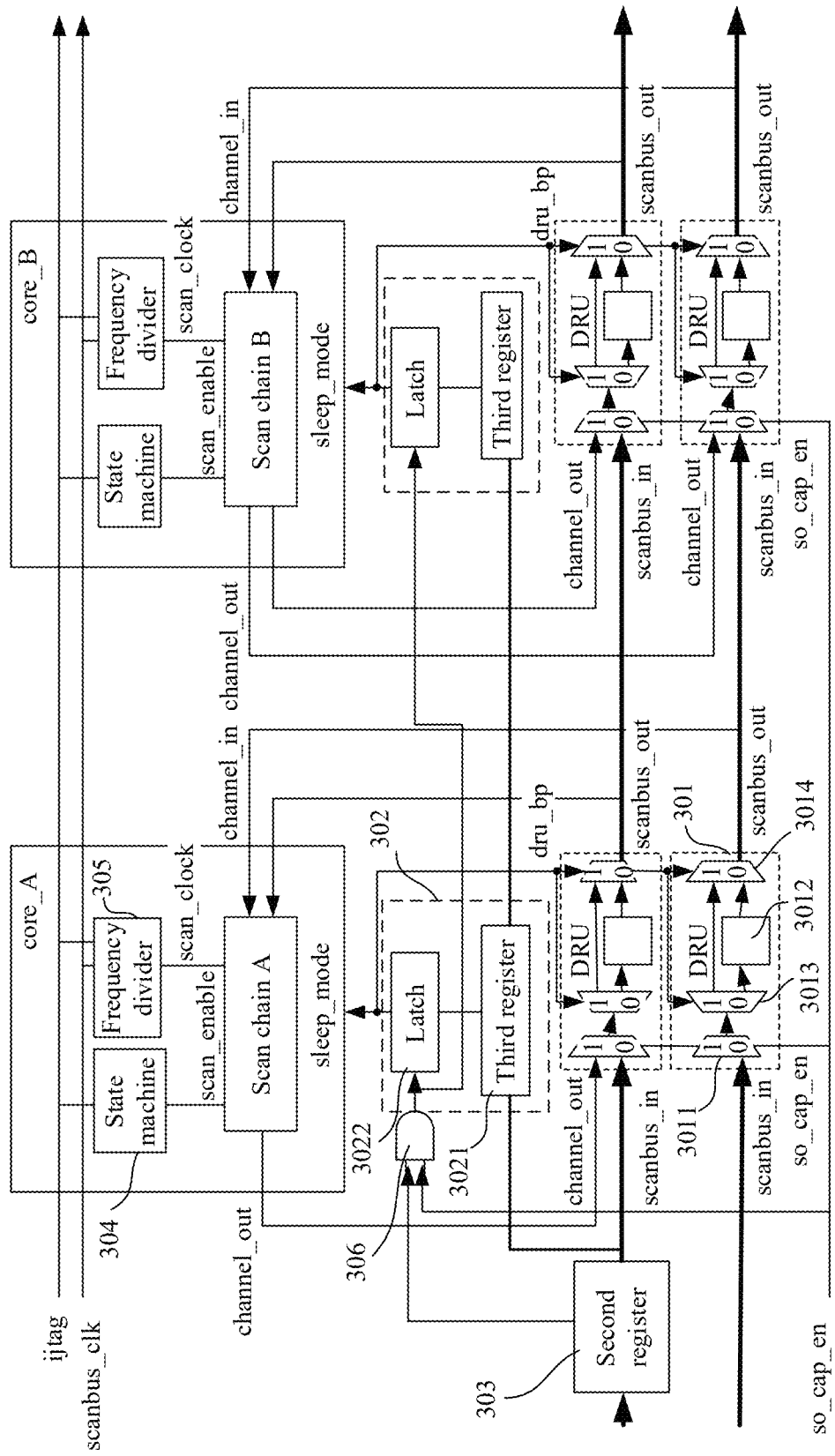
FIG. 4 is a schematic diagram 2 of structures of a circuit under test, a test bus, and a test circuit in FIG. 1.

FIG. 3 and FIG. 4 are respectively a schematic diagram 1 and a schematic diagram 2 of structures of the circuit under test 01, the test bus 02, and the test circuit 03. Referring to FIG. 3 and FIG. 4, in the entire test circuit 03, the data distribution circuit 301 may also be referred to as a dynamic routing unit (DRU). A role of the DRU is to distribute and transfer test excitation data. In a data distribution and transfer process, the data distribution circuit 301 is configured to: receive input data from the input channel scanbus_in of the test bus 02, and transfer the input data to the scan input channel channel_in in the circuit under test 01. After test scan of the circuit under test 01 is completed, the data distribution circuit 301 receives test result data from the scan output channel channel in the circuit under test 01, and transmits the test result data to the output channel scanbus_out of the test bus 02 for output, to complete testing. During testing, based on a specific test solution, each circuit under test 01 may be connected to the test bus 02 by using the data distribution circuit 301 in the test sub-circuit 30 corresponding to the circuit under test 01, to test the circuit under test 01. The test bus 02 is properly allocated by using the data distribution circuit 301 through specific test planning, to meet a requirement for testing a relatively large quantity of circuits under test 01, so as to optimize a line connection and reduce line congestion. In this way, test costs can be reduced, and a configuration process can be simplified to improve test efficiency.

A relationship between the test circuit, the circuit under test, and the bus is described below based on examples provided in FIG. 3 and FIG. 4.

For example, refer to the schematic diagrams provided in FIG. 3 and FIG. 4. In the schematic diagrams, the test circuit 03 shown in FIG. 1 includes the plurality of circuits under test 01 in FIG. 1, respectively corresponding to the plurality of test sub-circuits 30 shown in FIG. 1. A $j^{th}$ test sub-circuit 30 in the plurality of test sub-circuits 30 includes $N_j$ data distribution circuits 301 shown in FIG. 3 or FIG. 4. The $N_j$ data distribution circuits 301 are configured to connect a corresponding circuit under test 01 to the test bus 02. A quantity of data distribution circuits 301 in each test sub-circuit 30 is equal to a quantity of scan channels in a circuit under test 01 corresponding to the test sub-circuit 30. The quantity of scan channels in the circuit under test 01 is a maximum value in a quantity $CI_j$ of scan input channels channel_in and a quantity $CO_j$ of scan output channels channel_out in the circuit under test 01, in other words, $N_j = \max(CI_j, CO_j)$.

In the $j^{th}$ test sub-circuit 30, first input terminals of the $N_j$ data distribution circuits 301 are respectively connected to $N_j$ input channels scanbus_in of the test bus 02, first output terminals of $CI_j$ data distribution circuits 301 in the $N_j$ data distribution circuits 301 are respectively connected to $CI_j$ scan input channels channel_in in the circuit under test 01 corresponding to the test sub-circuit 30, second input terminals of $CO_j$ data distribution circuits 301 in the $N_j$ data distribution circuits 301 are respectively connected to $CO_j$ scan output channels channel_out in the circuit under test 01 corresponding to the test sub-circuit 30, and second output terminals of the $N_j$ data distribution circuits 301 are connected to $N_j$ output channels scanbus out of the test bus 02. It should be noted that the first output terminal and the second output terminal of the data distribution circuit 301 may be integrated into one output terminal, or may be disposed as two ports.

For a structure of the data distribution circuit 301, the data distribution circuit 301 may include a first selector 3011 and a first register 3012.

The first selector 3011 is configured to select an input of the data distribution circuit 301. An optional input of the data distribution circuit 301 receives the test excitation data from the test bus 02 or receives the test result data from the scan output channel channel_out in the corresponding circuit under test 01. Therefore, a first input terminal of the first selector 3011 is used as the first input terminal of the data distribution circuit 301, and a second input terminal of the first selector 3011 is used as the second input terminal of the data distribution circuit 301.

The first register 3012 is configured to temporarily store data received by the data distribution circuit 301. Therefore, an input terminal of the first register 3012 is connected to an output terminal of the first selector 3011, and an output terminal of the first register 3012 is used as the output terminal of the data distribution circuit 301.

It should be noted that some circuits under test 01 do not participate in testing in a test process. Therefore, the circuit under test 01 that does not participate in testing may be set to a sleep mode.

Figure 5:
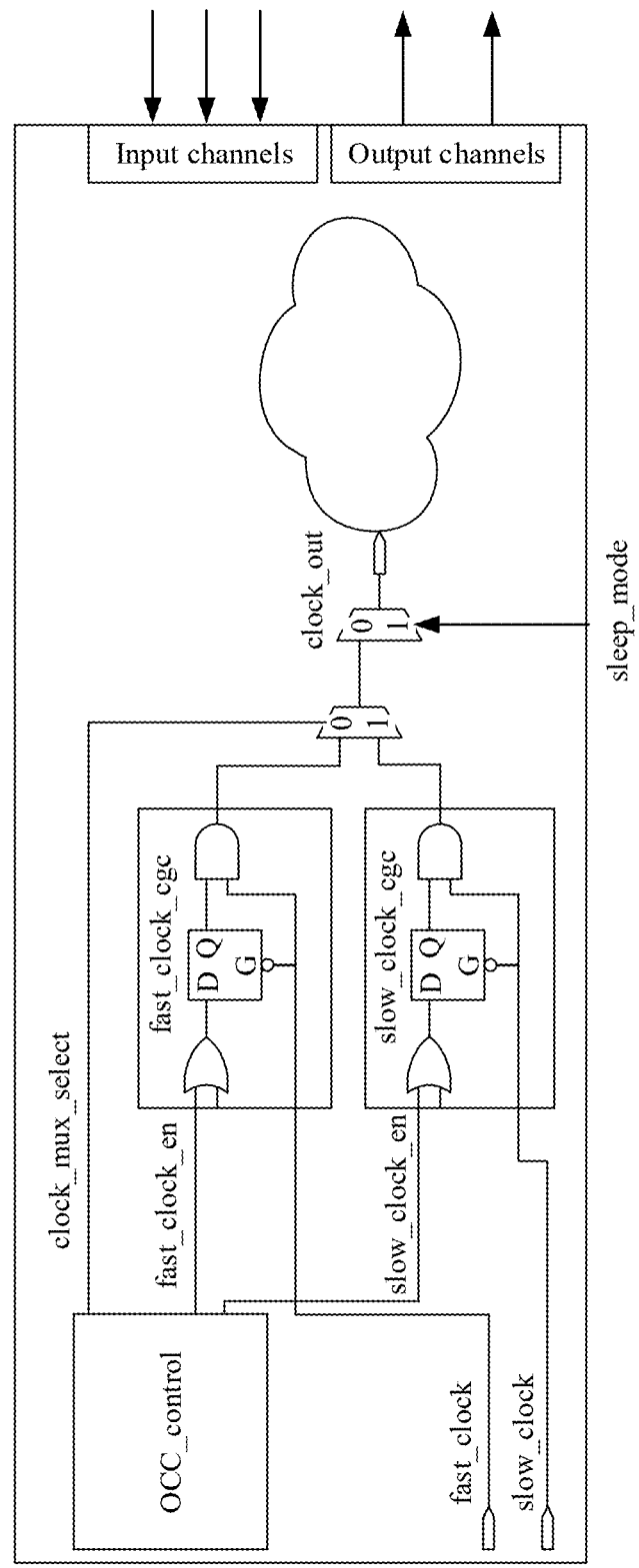
FIG. 5 is a schematic diagram of a scan chain of a circuit under test according to an embodiment of this disclosure.

FIG. 5 is a schematic diagram of a scan chain of a circuit under test. Referring to FIG. 5, there is an on chip clock (OCC) used for each circuit under test 01 in a scan chain of the circuit under test 01. There is a high-speed clock control module fast_clock_cgc, a low-speed clock control module slow_clock_cgc, and an on chip clock control module OCC_control in the scan chain of the circuit under test 01. The high-speed clock control module fast_clock_cgc is configured to implement gating of a high-speed clock, the low-speed clock control module slow_clock_cgc is configured to implement gating of a shift low-speed clock, and the on chip clock control module OCC_control is configured to: provide clock gating signals to the high-speed clock control module fast_clock_cgc and the low-speed clock control module slow_clock_cgc, and perform switching between the high-speed clock and the low-speed clock. In the scan chain of the circuit under test 01, a sleep control terminal sleep_mode may be disposed, so that when the circuit under test 01 does not participate in testing, the clock in the circuit under test 01 is turned off, and the scan input channel channel_in and the scan output channel channel_out in the circuit under test 01 are kept in an isolated state, that is, in a sleep mode. In this way, power consumption of the circuit under test 01 in a non-test state can be reduced.

To enable the circuit under test 01 to be configured to the sleep mode in the non-test state, in the schematic diagrams in FIG. 3 and FIG. 4, each test sub-circuit 30 further includes a configuration circuit 302. An input terminal of the configuration circuit 302 is connected to the test bus 02, and a first output terminal of the configuration circuit 302 is connected to the sleep control terminal sleep_mode of the circuit under test 01 corresponding to the test sub-circuit 30. That is, the sleep control terminal sleep_mode of the circuit under test 01 is configured by using the configuration circuit 302 in the test sub-circuit 30 corresponding to each circuit under test 01, so that the circuit under test 01 is maintained in the sleep mode in a non-test mode.

When the sleep control terminal sleep_mode of the circuit under test 01 is configured, configuration circuits 302 in the plurality of test sub-circuits 30 may be configured by using a plurality of inputs of the test bus 02, or data may be sequentially transmitted to configuration modules in different test sub-circuits 30 by using one input channel scanbus_in of the test bus 02 in different bus clock cycles, to complete configuration of the sleep mode for each different circuit under test 01.

One input channel scanbus_in of the test bus 02 may sequentially transmit data to configuration modules in different test sub-circuits 30 in different bus clock cycles, and the configuration modules in the plurality of test sub-circuits 30 may be connected in the following manner: An input terminal of a configuration circuit 302 in a first test sub-circuit 30 is connected to the input of the test bus 02, and an input terminal of a configuration circuit 302 in an $x^{th}$ test sub-circuit 30 is connected to a second output terminal of a configuration circuit 302 in an $(x-1)^{th}$ test sub-circuit 30, where x is a positive integer greater than or equal to 2.

To help sequentially transmit data to the configuration circuits 302, a second register 303 is further disposed in the test circuit. An input of the second register 303 is connected to the input of the test bus 02, and an output of the second register 303 is connected to the input terminal of the configuration circuit 302 in the first test sub-circuit 30.

The configuration circuit 302 in each test sub-circuit 30 may include a third register 3021 and a latch 3022, an input terminal of the third register 3021 is used as the input terminal of the configuration circuit 302, an output terminal of the third register 3021 is connected to an input terminal of the latch 3022, an output terminal of the latch 3022 is used as the first output terminal of the configuration circuit 302, and the output terminal of the third register 3021 is further used as a second output terminal of the configuration circuit 302.

The configuration circuit 302 may further include an AND gate 306, a first input terminal of the AND gate 306 is connected to the output terminal of the second register 303, a second input of the AND gate 306 is connected to a second state control terminal of a state machine 304, and an output terminal of the AND gate 306 is connected to a control terminal of the latch 3022 in each configuration circuit 302. The second state control terminal of the state machine 304 generates a scan capture enable signal so_cap_en to control data capture, for example, capture data in the latch 3022 in the configuration circuit 302 in each test sub-circuit 30 and transmit the data to the sleep control terminal sleep_mode of the circuit under test 01, load the test excitation data in the data distribution circuit 301 to the scan input channel channel_in in the circuit under test 01, or collect data on the scan output channel channel_out in the circuit under test 01, and transmit the data to the data distribution circuit 301.

For example, in the schematic diagram in FIG. 3, it is assumed that a circuit under test A is in a non-test state, and a circuit under test B is in a test state. When a signal received by the sleep control terminal sleep_mode of the circuit under test 01 is "0", the circuit under test 01 is in the sleep mode. Therefore, when the circuit under test 01 is configured, a signal "0" needs to be provided to the circuit under test A, and a signal "1" needs to be provided to a sleep control terminal sleep_mode of the circuit under test B. Therefore, the second register 303 sequentially transmits data "1" and "0" to a third register 3021 corresponding to the circuit under test B and a third register 3021 corresponding to the circuit under test A. Then, the second register 303 is set to "1", and the scan capture enable signal so_cap_en is set to "1" by using the state machine 304. In this case, the latch 3022 in each test sub-circuit 30 may collect a value in the corresponding third register 3021, and transmit the collected value to the sleep control terminal sleep_mode of the corresponding circuit under test 01, to complete configuration of the sleep mode.

It should be further noted that after the sleep mode of the circuit under test 01 is configured, a test scan phase may be entered, and is triggered by a scan enable signal scan_enable. The scan enable signal scan_enable is configured by a first state terminal of the state machine 304. The state machine 304 may be configured by using an IEEE 1687 standard (Internal JTAG) protocol pin.

Referring to FIG. 4, a bypass design is added to the data distribution circuit 301. After the bypass design is added, when the circuit under test 01 corresponding to the test sub-circuit 30 is in the non-test state, the first input terminal and the output terminal of the data distribution circuit 301 may not pass through the first register 3012, to reduce a quantity of unnecessary shift beats, so as to reduce a test time.

Specifically, the data distribution circuit 301 further includes a data distributor 3013 and a second selector 3014. An input terminal of the data distributor 3013 is connected to the output terminal of the first selector 3011, a first output terminal of the data distributor 3013 is connected to the input terminal of the first register 3012, a first input terminal of the second selector 3014 is connected to the output terminal of the first register 3012, a second input terminal of the second selector 3014 is connected to a second output terminal of the data distributor 3013, and an output terminal of the second selector 3014 is used as the output terminal of the data distribution circuit 301. A control terminal of the second selector 3014 is connected to the output terminal of the configuration circuit 302. That is, when the configuration circuit 302 configures the corresponding circuit under test 01 to the sleep mode, the corresponding data distribution circuit 301 may be configured to a bypass mode, so that data input from the test bus 02 is directly output without passing through the first register 3012 in the data distribution circuit 301.

In FIG. 3 and FIG. 4, optionally, each test sub-circuit 30 may further include a frequency dividing circuit 305. The frequency dividing circuit 305 may be implemented by using a frequency divider (DIV). The frequency dividing circuit 305 is connected to a bus clock interface and a scan clock interface of the circuit under test 01, and is configured to divide a clock scanbus_clk of the test bus 02 into a scan clock scan_clock in the circuit under test 01.

It should be noted that when the frequency divider is used for frequency division, a frequency division ratio of the frequency divider is determined based on the quantity of scan channels in the circuit under test 01 that is to be tested and the test bus 02. A high-speed scan clock of the test bus 02 is divided into a low-speed scan clock in the circuit under test 01, to facilitate a scan test of the circuit under test 01.

Figure 6:
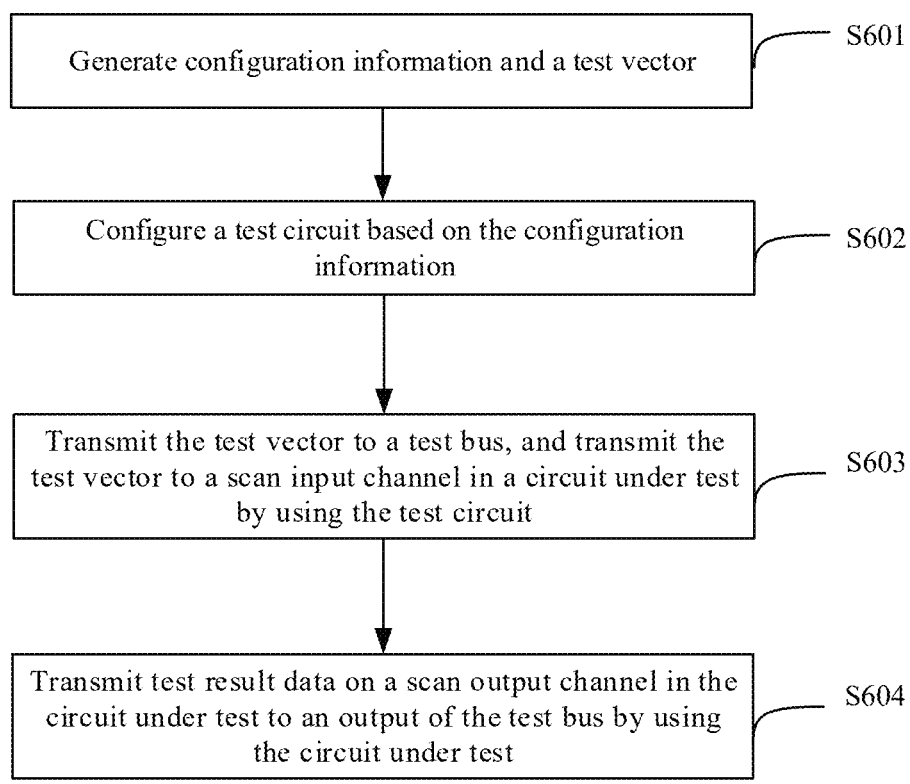
FIG. 6 is a flowchart of a circuit test method according to an embodiment of this disclosure.

For example, FIG. 6 is a flowchart of a circuit test method according to an embodiment of this disclosure. The circuit test method may be used in electronic design automation (EDA) software, and is applicable to a case in which a circuit under test 01 is tested by using any test circuit 03 shown in FIG. 3 and FIG. 4.

Referring to FIG. 6, the circuit test method includes the following steps.

S601. Generate configuration information and a test vector. It should be understood that the configuration information and the test vector may be generated by the EDA software. In a test process, the EDA software may generate the configuration information and test excitation data based on some test parameters provided by a tester. The configuration information may be used to configure the test circuit 03. The test vector is test excitation data of the circuit under test 01, and is determined based on a circuit structure of the circuit under test 01.

S602. Configure the test circuit 03 based on the configuration information. Specifically, the test circuit 03 may be configured by performing the following steps.

In a first step, all circuits under test 01 are grouped based on a grouping rule. In an actual test process, a bit width of a test bus 02 is limited, and therefore all the circuits under test 01 need to be grouped based on the grouping rule in the test process.

The grouping rule may be that a quantity of data distribution circuits 301 required in each group is less than or equal to the bit width of the test bus 02, and the quantity of data distribution circuits 301 corresponds to a quantity of scan channels in the circuit under test 01. That is, a quantity of data distribution circuits 301 required in each circuit under test 01 is a maximum value in a quantity of scan input channels and a quantity of scan output channels in the circuit under test 01.

Therefore, before grouping is performed, a quantity of scan channels in each circuit under test 01 and the bit width of the test bus 02 need to be obtained, and a sum of quantities of scan channels in all the circuits under test 01 is calculated based on the quantity of scan channels in each circuit under test 01. When the sum of the quantities of scan channels in all the circuits under test 01 exceeds the bit width of the test bus 02, the circuits under test 01 that are to be tested are grouped into a plurality of test groups, and a sum of quantities of scan channels in circuits under test 01 included in each test group should be less than or equal to the bit width of the test bus 02.

Figure 7:
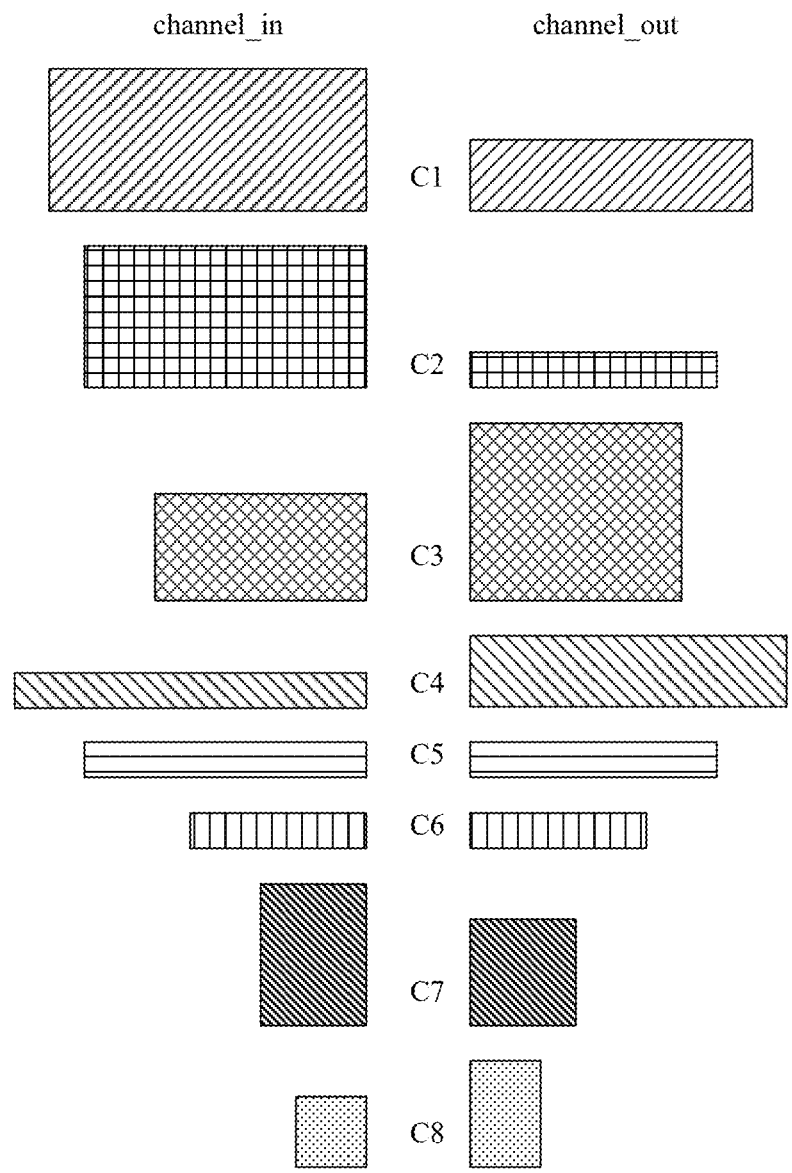
FIG. 7 is a schematic diagram of a resource requirement of a circuit under test according to an embodiment of this disclosure.
Figure 8:
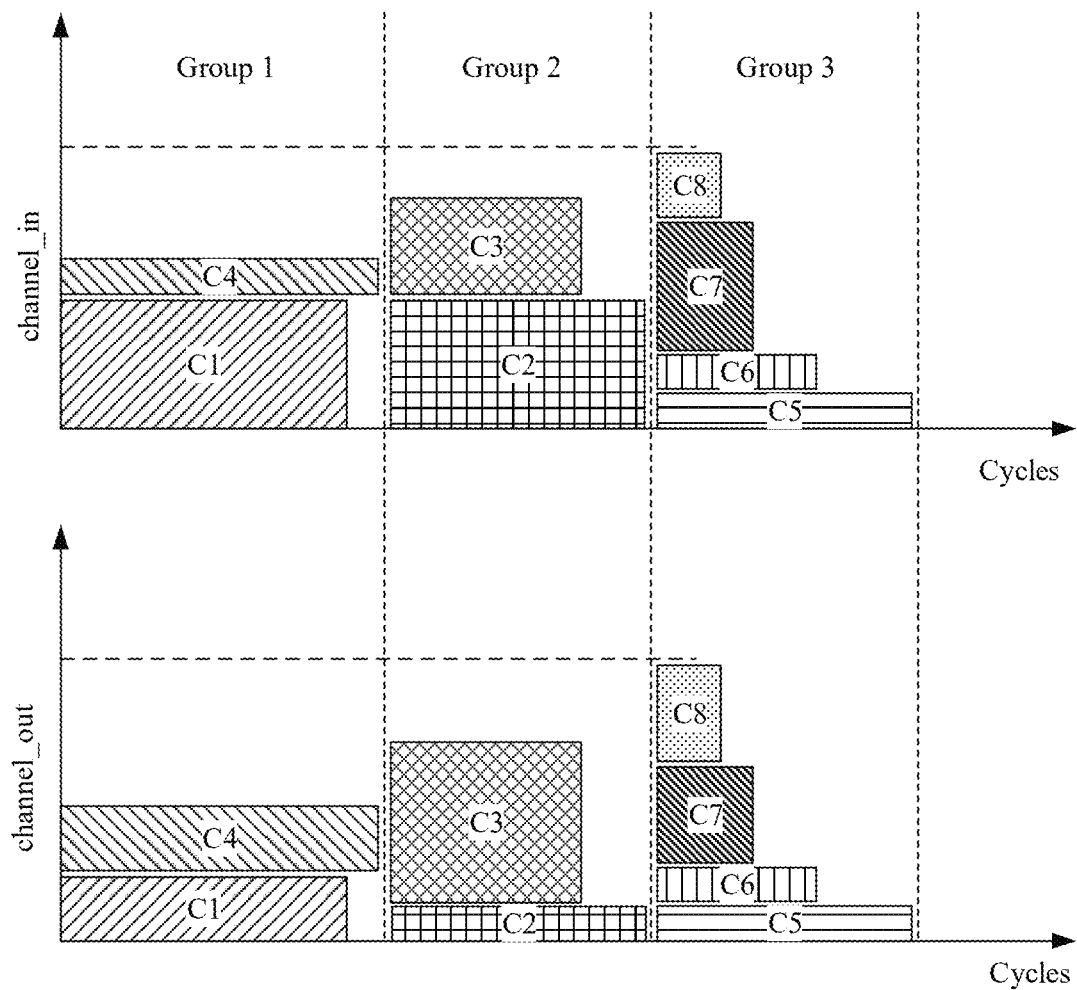
FIG. 8 is a schematic diagram of a circuit test planning and grouping solution according to an embodiment of this disclosure.

FIG. 7 is a schematic diagram of a resource requirement of a circuit under test 01 according to an embodiment of this disclosure. FIG. 7 is a schematic diagram of resource requirements of eight circuits under test 01, namely, C1-C8. In the schematic diagram of the resource requirements, a rectangular block is used to represent a test resource requirement of the circuit under test, a height represents a quantity of scan channels in the circuit under test 01, and a width represents a quantity of test time cycles required for testing the circuit under test 01. If test groups cannot be tested in series, resource blocks corresponding to the eight circuits under test 01 may be stacked by stacking rectangular blocks based on the grouping rule, and during stacking, a total height existing after the resource blocks are stacked does not exceed the bit width of the test bus 02. For example, FIG. 8 is a schematic diagram of a test planning and grouping solution designed for the eight circuits under test 01 in FIG. 7.

It may be understood that if a total test time needs to be minimized, circuits under test 01 for which a similar quantity of test time cycles is required for testing may be grouped into a same group for stacking.

Figure 9:
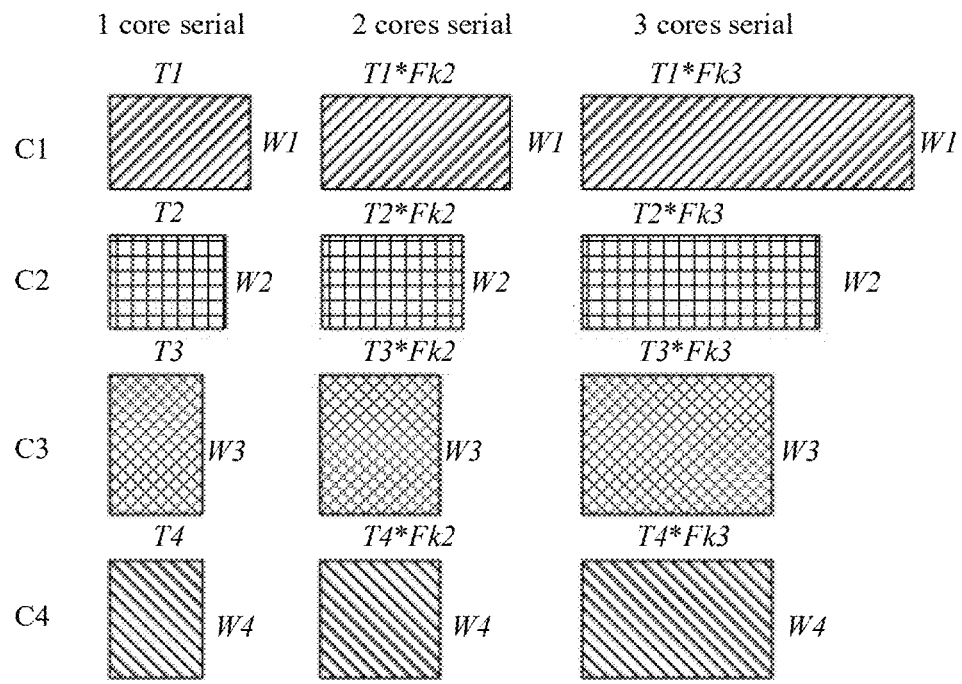
FIG. 9 is a schematic diagram of a resource requirement of another circuit under test according to an embodiment of this disclosure.

FIG. 9 is a schematic diagram of a resource requirement of another circuit under test 01 according to an embodiment of this disclosure. In the schematic diagram of the resource, a diagram of a resource requirement existing when a test group may be tested in series with another test group is shown. The bit width of the test bus 02 is limited, and therefore when the test groups or the circuits under test 01 are tested in series, the test excitation data needs to pass through a plurality of data distribution circuits 301 for a same bus during serial transmission. Therefore, when a serial test is performed, a test time of each test circuit 01 increases. That is, when a circuit under test 01 is tested in series with another circuit under test 01, a test time of the circuit under test 01 needs to be multiplied by a coefficient $F_k$. A formula for calculating $F_k$ is as follows:

$$F_k((\text{Freq}_{core}/\text{Freq}_{bus})*\#\text{active groups})+1, \text{ where}$$

$Freq_{core}$ is a scan clock frequency of the circuit under test 01, $Freq_{bus}$ is a clock frequency of the test bus 02, and #active groups is a quantity of circuits under test 01 in a test state.

It is assumed that a quantity of scan channels in a specific circuit under test 01 is Wj, and a test time existing when the circuit under test is independently tested is Tj. Therefore, when the circuit under test 01 is tested in series with another circuit under test 01, a test time of the circuit under test 01 is $Tj*F_k$. A rectangle may be used for representation. A height of the rectangle is the quantity of scan channels in the circuit under test 01, and a width of the rectangle is the test time required for the circuit under test 01. Therefore, as a quantity of circuits under test 01 that participate in the serial test increases, an actual test time of the circuit under test 01 increases. Referring to FIG. 9, when a single circuit under test is tested, which corresponds to 1 core serial in FIG. 9, it indicates that the circuit under test is not tested in series with another circuit under test during testing; when two circuits under test are tested in series, which corresponds to 2 cores serial in FIG. 9, it indicates that the circuit under test is tested in series with one circuit under test during testing; or when three circuits under test are tested in series, which corresponds to 3 cores serial in FIG. 9, it indicates that the circuit under test is tested in series with two circuits under test during testing.

Figure 10:
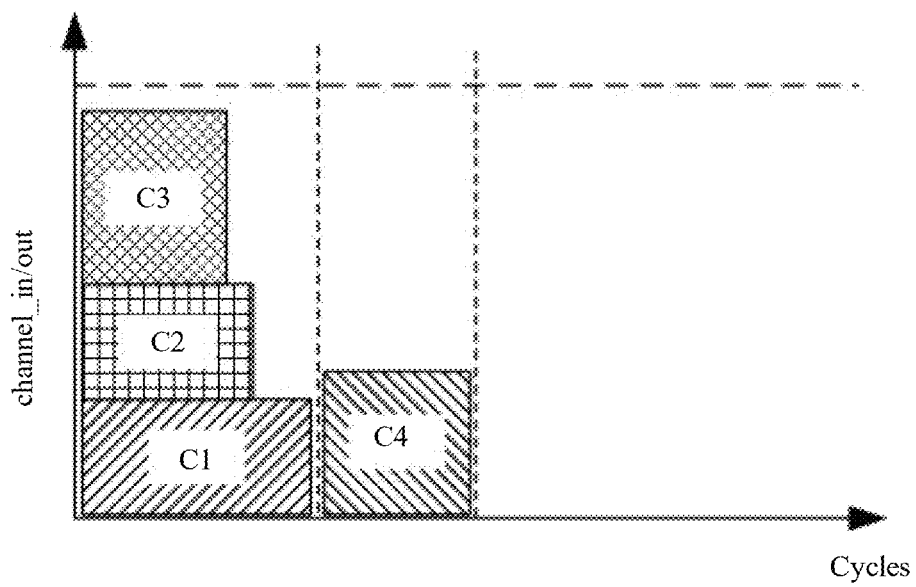
FIG. 10 is a schematic diagram of another circuit test planning and grouping solution according to an embodiment of this disclosure.

In this case, the circuits under test 01 may be similarly grouped by stacking rectangles. When the circuit under test 01 needs to be tested in series with several other circuits under test 01, corresponding rectangles by which the coefficient $F_K$ is multiplied may be selected when the rectangles are stacked. In addition, it needs to be further met that when a total height of the rectangles does not exceed the bit width of the test bus 02, the rectangles are stacked upward as much as possible, to minimize a total test time. FIG. 10 shows a possible test planning and grouping solution corresponding to the schematic diagram of the resource requirement in FIG. 9. A circuit under test C1, a circuit under test C2, and a circuit under test C3 form a group, and a circuit under test C4 forms a group.

In a second step, a test sub-circuit 30 corresponding to each circuit under test 01 is configured based on a grouping result.

All the circuits under test 01 are connected to the test bus 02 by using the data distribution circuit 301 based on the grouping result, a correspondence between a scan input channel in the circuit under test 01 and an input of the test bus 02 is determined, and a correspondence between a scan output channel in the circuit under test 01 and an output of the test bus 02 is determined.

Figure 11:
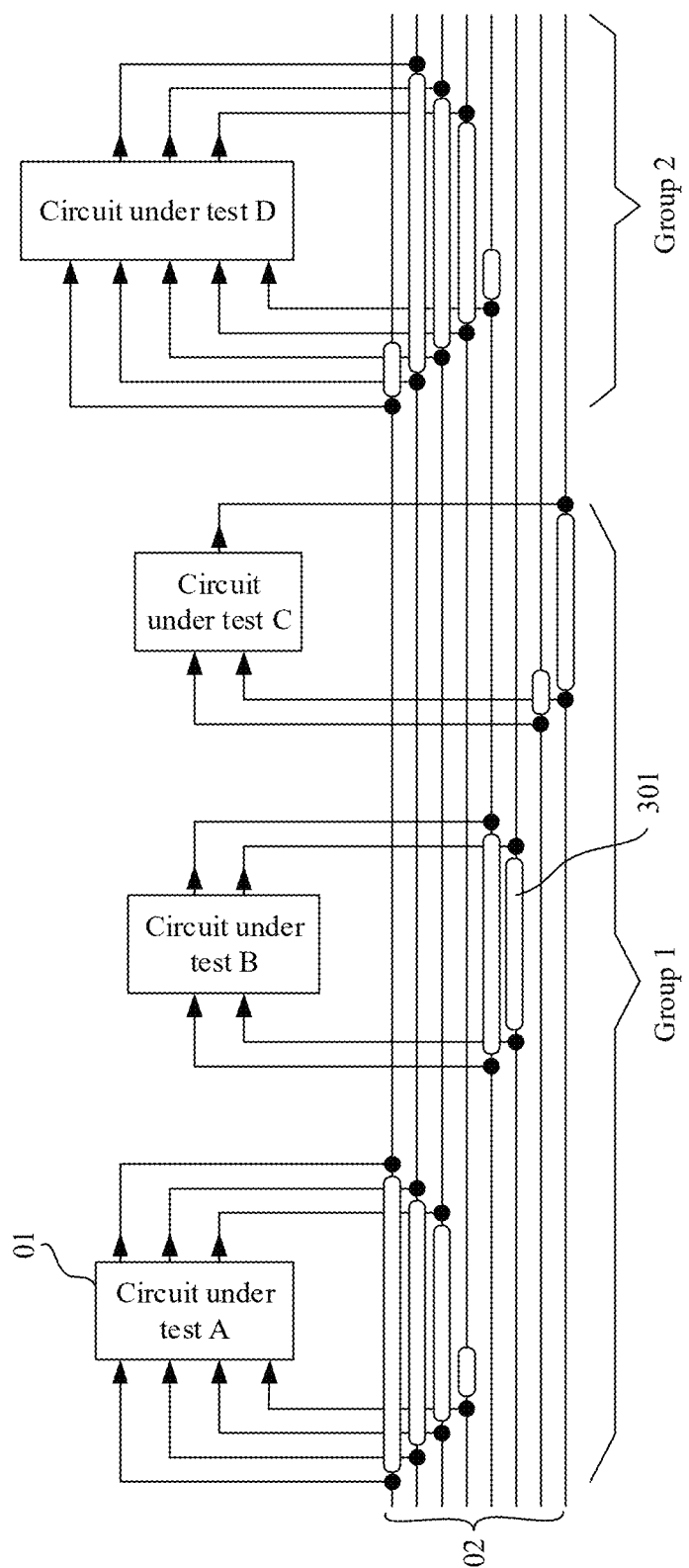
FIG. 11 is a schematic diagram of a relationship between a circuit under test and a test bus existing after test grouping is performed according to an embodiment of this disclosure.

For example, FIG. 11 is a schematic diagram of a connection relationship between a circuit under test 01 and a test bus 02 existing after test grouping is performed according to an embodiment of this disclosure. FIG. 11 shows a connection relationship between each of four circuits under test 01 and the test bus 02. A circuit under test A includes four scan input channels and three scan output channels, a circuit under test B includes two scan input channels and two scan output channels, a circuit under test C includes two scan input channels and one scan output channel, and a circuit under test D includes five scan output channels. According to the foregoing grouping method, the circuit under test A, the circuit under test B, the circuit under test C, and the circuit under test D may be grouped into two test groups. A first test group (Group1) includes the circuit under test A, the circuit under test B, and the circuit under test C, and eight data distribution circuits 301 are used. A second test group (Group 2) includes the circuit under test D, and five data distribution circuits 301 are used.

In a same test group, a total quantity of scan channels in all circuits under test 01 is less than or equal to the bit width of the test bus 02. Therefore, all the circuits under test 01 in the same test group may be tested in parallel. When the circuits under test 01 are tested in parallel, there is a one-to-one correspondence for the input and the output of the test bus 02 and the data distribution circuit 301. Therefore, in a same test group, different scan input channels in the circuit under test 01 correspond to different inputs of the test bus 02, and different scan output channels in the circuit under test 01 correspond to different outputs of the test bus 02.

In addition, to reduce test power consumption and a test time, a circuit under test 01 that does not participate in testing may be configured to a sleep mode, and a data distribution circuit 301 used in the circuit under test 01 is configured to a bypass mode by using a configuration module.

For example, in an example in FIG. 11, the first test group and the second test group may be tested in series if the test power consumption permits. If the second test group is tested after the first test group is tested, a circuit under test 01 in a test group that does not participate in testing may be configured to the sleep mode, and a data distribution circuit 301 used for the test group may be configured to the bypass mode.

Figure 12:
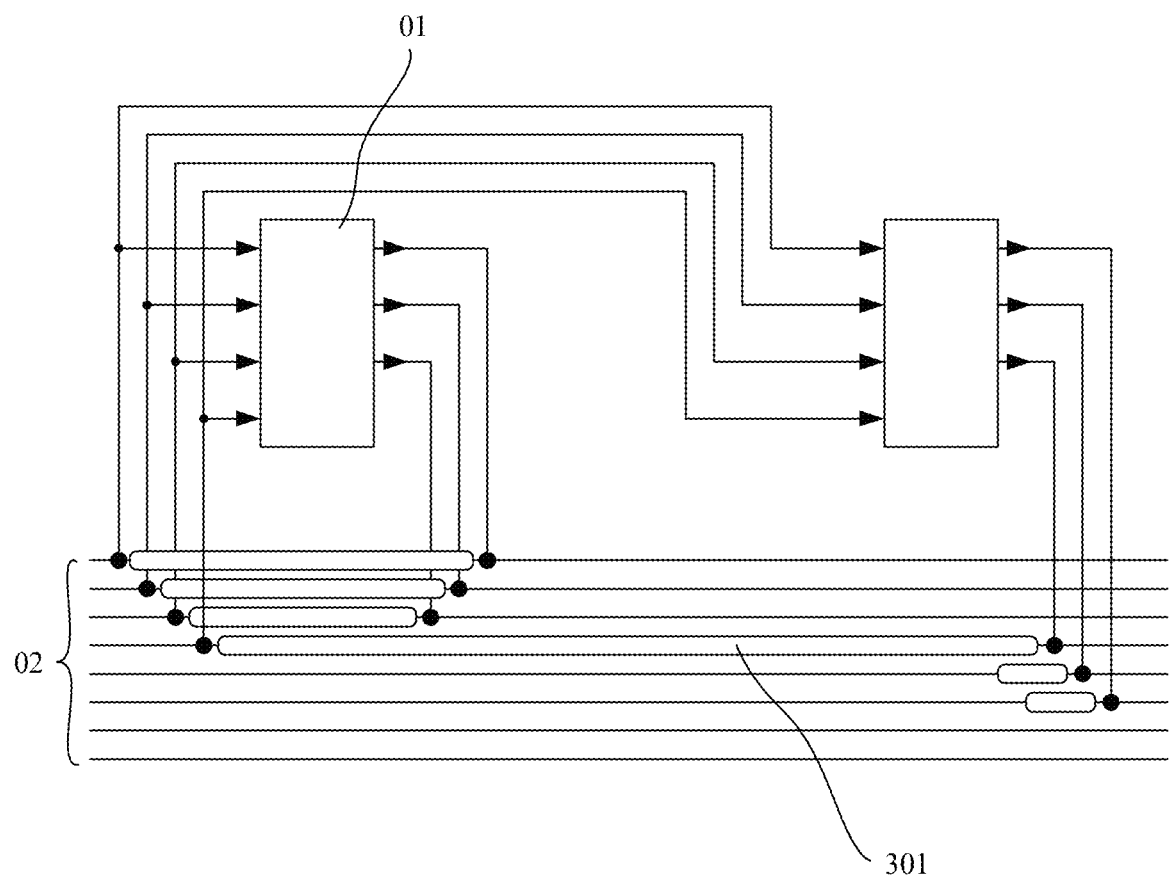
FIG. 12 is a schematic diagram of a relationship between circuits under test and a test bus existing when the circuits under test of a same structure are tested according to an embodiment of this disclosure.

FIG. 12 is a schematic diagram of a connection relationship between circuits under test 01 and the test bus 02 existing when the circuits under test 01 of a same structure are tested according to an embodiment of this disclosure. In a same test group, when structures of two circuits under test 01 are the same, scan input channels at a same position in the two circuits under test 01 are connected to a same data distribution circuit 301. When circuits under test 01 of an exactly same structure are tested, same test excitation data is required for the circuits under test 01. Therefore, when the circuits under test 01 of a same structure are tested, the test excitation data may be transmitted to scan input channels at a same position in the circuits under test 01 by using a same data distribution circuit 301. During output, different data distribution circuits 301 are used for transmission, to distinguish and determine whether the circuit under test 01 is faulty.

In addition, a frequency division ratio of a frequency dividing circuit 305 needs to be configured in a configuration process. The frequency division ratio of the frequency dividing circuit 305 is determined based on a quantity of scan input channels channel_in and a quantity of scan output channels channel_out in a circuit under test 01 that is to be tested and that exists after grouping is performed and the bit width of the test bus 02. A formula for calculating the frequency division ratio $R_{div}$ of the frequency dividing circuit 305 is as follows:

$$R_{div} = \lceil Max(\Sigma CI_i, \Sigma CO_i B) \rceil + 1, \text{ where}$$

$CI_i$ is a quantity of scan input channels in an $i^{th}$ circuit under test that is to be tested, $CO_i$ is a quantity of scan output channels in the $i^{th}$ circuit under test that is to be tested, and B is the bit width of the bus.

S603. Transmit the test vector to the test bus 02, and transmit the test vector to the scan input channel in the circuit under test 01 by using the test circuit 03. In this step, the test vector may be transmitted to the scan input channel in the circuit under test 01 based on the correspondence between the scan input channel in the circuit under test 01 and the input of the test bus 02 by using the input of the test bus 02 corresponding to the scan input channel in the circuit under test 01.

For circuits under test 01 that are to be tested in parallel, the test excitation data needs to be transmitted only for one time to perform a scan test. However, for circuits under test 01 that are to be tested in series, the test bus 02 is multiplexed, and for different circuits under test 01 or different scan input channels in the circuit under test 01, the test excitation data needs to be sequentially transmitted in a time division multiplexing manner based on a data transmission sequence. That is, the test bus 02 sequentially transmits, in a plurality of bus clock cycles, the test vector to scan input channels in the circuit under test 01 that is to be tested. One input of the test bus 02 corresponds to more than one scan input channel in the circuit under test 01.

S604. Transmit test result data of the circuit under test 01 to the output of the test bus 02 by using the circuit under test 01. For example, based on the correspondence between the scan output channel in the circuit under test 01 and the output of the test bus 02, the test result data output by the scan output channel in the circuit under test 01 is transmitted to the output of the test bus 02 corresponding to the scan output channel in the circuit under test 01.

Similarly, for circuits under test 01 that are to be tested in parallel, the test result data needs to be transmitted only for one time to perform a scan test. However, for circuits under test 01 that are to be tested in series and for different circuits under test 01 or different scan input channels in the circuit under test 01, the test result data needs to be sequentially transmitted in a time division multiplexing manner based on a data transmission sequence. That is, the test bus 02 sequentially transmits test result data on scan output channels in the circuit under test 01 to the output of the test bus 02 in a plurality of clock cycles. One output of the test bus 02 corresponds to more than one scan output channel in the circuit under test 01.

Figure 13:
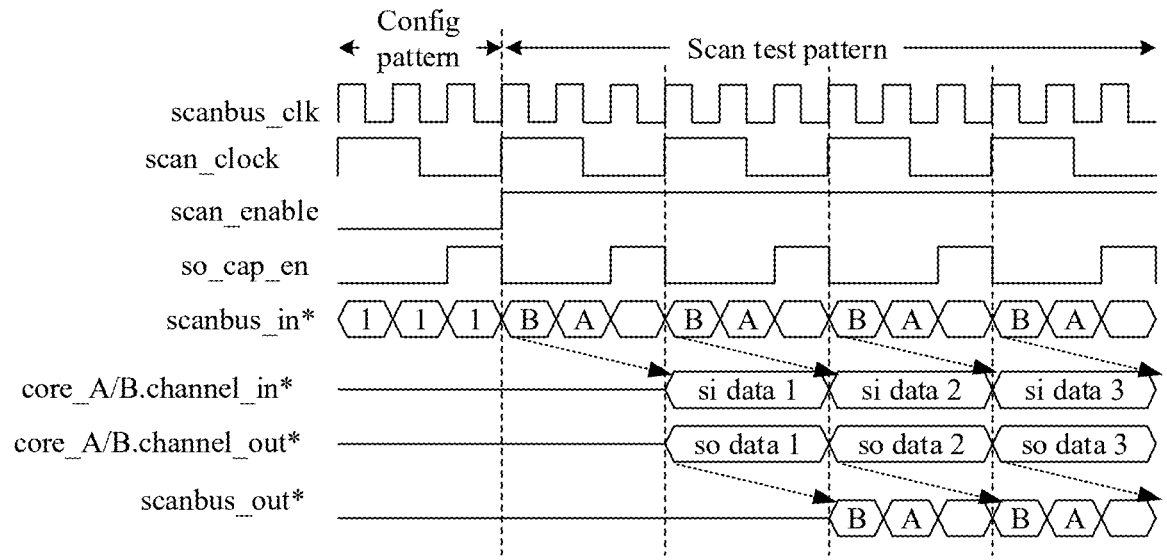
FIG. 13 is a schematic diagram of a waveform of a test solution in which a circuit under test A and a circuit under test B are tested in series in an example shown in FIG. 4.

For steps S603 and S604, refer to a schematic diagram of a waveform of a test solution in FIG. 13. FIG. 13 is a schematic diagram of a waveform of a test solution in which a circuit under test A and a circuit under test B are tested in series in an example shown in FIG. 4.

Referring to FIG. 4, the circuit under test A includes two scan input channels and one scan output channel, and the circuit under test B includes two scan input channels and two scan output channels. It is assumed that the bit width of the test bus 02 is 2. Therefore, the circuit under test A and the circuit under test B need to be tested in series, and each of the circuit under test A and the circuit under test B corresponds to two data distribution circuits 301.

Referring to the schematic diagram of the waveform in FIG. 13, before testing is performed, the test circuit 03 needs to be configured by using a configuration circuit 302 in the test sub-circuit 30 corresponding to the circuit under test 01, and values in third registers 3021 in all configuration circuits 302 need to be sequentially configured by using a second register 303. For the circuit under test A and the circuit under test B, both the two circuits under test are in a test state. Therefore, a sleep control terminal sleep_mode of each circuit under test may be set to "1" by using the configuration circuit 302. It is assumed that when "1" is set, the circuit under test is in the test state. When the values in the third registers 3021 in the circuit under test A and the circuit under test B are shifted by the second register 303, a scan capture enable signal so_cap_en is set to "1". After configuration is completed, the second register 303 is set to "1", and the scan capture enable signal so_cap_en is configured to "1" by using a state machine 304, so that a latch 3022 collects the value in the third register 3021, and transmits the value to the sleep control terminal of the circuit under test 01, to complete configuration indicating that the circuit under test 01 is in the test state.

After configuration is completed, the second register 303 is set to "0", and a value in the latch 3022 is maintained. Then, there are two clock cycles based on a time division multiplexing manner. During data shifting, the scan capture enable signal so_cap_en is set to "0", data is sequentially transmitted to the data distribution circuits 301 corresponding to the circuit under test B and the circuit under test A by using the test bus 02, and after transmission is completed, the scan capture enable signal is set to "1" by using the state machine 304; and the test excitation data in the data distribution circuits 301 is transmitted to the scan input channels in the circuit under test A and the circuit under test B, and test result data on the scan output channels in the circuit under test A and the circuit under test B is transmitted to the corresponding data distribution circuits 301, to complete data transmission and testing.

It should be noted that each time the test bus 02 transmits scan data in one cycle, a bus clock cycle is added to transmit test vector data in the data distribution circuit 301 to the scan input channel channel_in in the circuit under test 01, and transmit the test result data on the scan output channel channel_out in the circuit under test 01 to the data distribution circuit 301, for example, a time at which the scan capture enable signal is set to "1" in the example in FIG. 13. The scan data in one cycle refers to test scan data obtained after all the circuits under test 01 that are to be tested are tested for one time.

Figure 14:
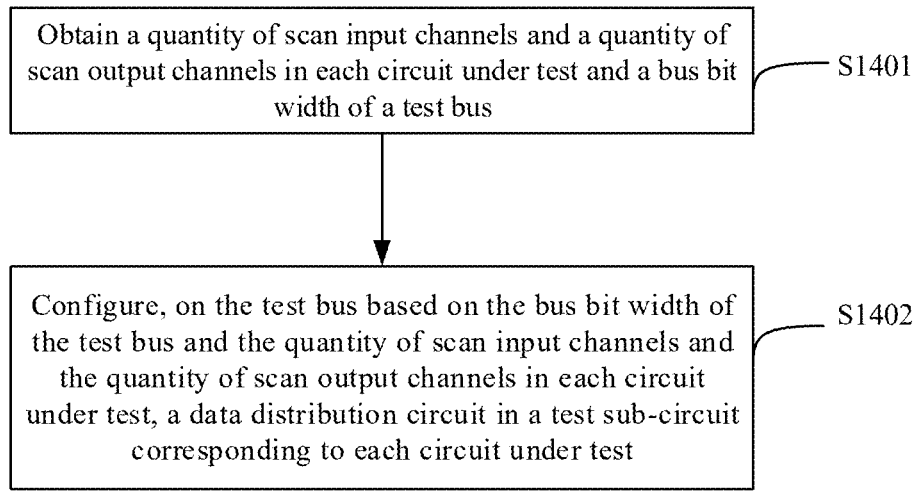
FIG. 14 is a flowchart of a test circuit design method according to an embodiment of this disclosure.

For example, FIG. 14 is a flowchart of a test circuit design method according to an embodiment of this disclosure.

Referring to FIG. 14, the test circuit design method includes the following steps:

S1401. Obtain a quantity of scan input channels and a quantity of scan output channels in each circuit under test 01 and a bus bit width of a test bus 02.

S1402. Configure, on the test bus 02 based on the bus bit width of the test bus 02 and the quantity of scan input channels and the quantity of scan output channels in each circuit under test 01, a data distribution circuit 301 in a test sub-circuit 30 corresponding to each circuit under test 01, to generate any one of the test circuits shown in FIG. 3 or FIG. 4.

A quantity of data distribution circuits 301 in the test sub-circuit 30 corresponding to each circuit under test 01 is determined based on the quantity of scan input channels and the quantity of scan output channels in each circuit under test 01.

In the examples in FIG. 3 and FIG. 4, the quantity of data distribution circuits 301 in the test sub-circuit 30 corresponding to each circuit under test 01 is associated with the quantity of scan input channels channel_in and the quantity of scan output channels channel_out in the circuit under test 01, that is, is equal to a maximum value in the quantity of scan input channels channel in and the quantity of scan output channels channel_out in the corresponding circuit under test 01.

The foregoing descriptions are merely specific implementations of this application, but are not intended to limit the protection scope of this application. Any variation or replacement readily figured out by a person skilled in the art within the technical scope disclosed in this disclosure shall fall within the protection scope of this application. Therefore, the protection scope of this application shall be subject to the protection scope of the claims.

What is claimed is:

1. A test circuit, comprising:
a plurality of test sub-circuits respectively corresponding to a plurality of circuits under test, wherein a $j^{th}$ test sub-circuit in the plurality of test sub-circuits comprises $N_j$ data distribution circuits, and the $N_j$ data distribution circuits are configured to connect a corresponding circuit under test to a test bus; and
in the $j^{th}$ test sub-circuit, first input terminals of the $N_j$ data distribution circuits are respectively connected to $N_j$ inputs of the test bus, output terminals of $CI_j$ data distribution circuits in the $N_j$ data distribution circuits are respectively connected to $CI_j$ scan input channels in the circuit under test corresponding to the test sub-circuit, second input terminals of $CO_j$ data distribution circuits in the $N_j$ data distribution circuits are respectively connected to $CO_j$ scan output channels in the circuit under test corresponding to the test sub-circuit, and output terminals of the $N_j$ data distribution circuits are further connected to $N_j$ outputs of the test bus, wherein $N_j$=max $(CI_j, CO_j)$; and
wherein the data distribution circuit comprises a first selector and a first register, a first input terminal of the first selector is configured to operate as the first input terminal of the data distribution circuit, a second input terminal of the first selector is configured to operate as the second input terminal of the data distribution circuit, an output terminal of the first selector is connected to an input terminal of the first register, and an output terminal of the first register is configured to operate as the output terminal of the data distribution circuit.

2. The test circuit according to claim 1, wherein the data distribution circuit further comprises a data distributor and a second selector, an input terminal of the data distributor is connected to the output terminal of the first selector, a first output terminal of the data distributor is connected to the input terminal of the first register, a first input terminal of the second selector is connected to the output terminal of the first register, a second input terminal of the second selector is connected to a second output terminal of the data distributor, and an output terminal of the second selector is used as the output terminal of the data distribution circuit.

3. The test circuit according to claim 1, wherein each test sub-circuit further comprises a state machine, and the state machine comprises:
a first state control terminal that is connected to a scan enable terminal of a scan chain of a circuit under test corresponding to the test sub-circuit; and
a second state control terminal that is connected to a control terminal of the first selector.

4. The test circuit according to claim 3, wherein each test sub-circuit further comprises a configuration circuit, an input terminal of the configuration circuit is connected to the test bus, and a first output terminal of the configuration circuit is connected to a sleep control terminal of the circuit under test corresponding to the test sub-circuit, and is connected to control terminals of the data distributor and the second selector.

5. The test circuit according to claim 4, wherein an input terminal of a configuration circuit in a first test sub-circuit is connected to the input of the test bus, and an input terminal of a configuration circuit in an $x^{th}$ test sub-circuit is connected to a second output terminal of a configuration circuit in an $(x-1)^{th}$ test sub-circuit, wherein x is a positive integer greater than or equal to 2.

6. The test circuit according to claim 5, wherein
the test circuit further comprises a second register, an input of the second register is connected to the input of the test bus, and an output of the second register is connected to the input terminal of the configuration circuit in the first test sub-circuit.

7. The test circuit according to claim 6, wherein the configuration circuit in each test sub-circuit comprises a third register and a latch, an input terminal of the third register is used as the input terminal of the configuration circuit, an output terminal of the third register is connected to an input terminal of the latch, an output terminal of the latch is used as the first output terminal of the configuration circuit, and the output terminal of the third register is further used as a second output terminal of the configuration circuit.

8. The test circuit according to claim 7, wherein the configuration circuit further comprises an AND gate, a first input terminal of the AND gate is connected to the output terminal of the second register, a second input of the AND gate is connected to the second state control terminal of the state machine, and an output terminal of the AND gate is connected to a control terminal of the latch in each configuration circuit.

9. The test circuit according to claim 1, wherein each test sub-circuit further comprises a frequency dividing circuit, and the frequency dividing circuit is connected to a bus clock and a scan clock in the scan chain of the circuit under test corresponding to the test sub-circuit.

10. A circuit test method, wherein the method is applicable to a case in which a circuit under test is tested by using a test circuit, and the test circuit comprises:
a plurality of test sub-circuits respectively corresponding to a plurality of circuits under test, wherein a $j^{th}$ test sub-circuit in the plurality of test sub-circuits comprises $N_j$ data distribution circuits, and the $N_j$ data distribution circuits are configured to connect a corresponding circuit under test to a test bus; and
in the $j^{th}$ test sub-circuit, first input terminals of the $N_j$ data distribution circuits are respectively connected to $N_j$ inputs of the test bus, output terminals of $CI_j$ data distribution circuits in the $N_j$ data distribution circuits are respectively connected to $CI_j$ scan input channels in the circuit under test corresponding to the test sub-circuit, second input terminals of $CO_j$ data distribution circuits in the $N_j$ data distribution circuits are respectively connected to $CO_j$ scan output channels in the circuit under test corresponding to the test sub-circuit, and output terminals of the $N_j$ data distribution circuits are further connected to $N_j$ outputs of the test bus, wherein $N_j$=max $(CI_j, CO_j)$; and
the method comprises:
generating configuration information and a test vector that comprises text excitation data of the circuit under test, wherein
configuring a test circuit based on the configuration information;
transmitting the test vector to a test bus, and transmitting the test vector to a scan input channel in the circuit under test by using the test circuit;
transmitting test result data of the circuit under test to an output of the test bus by using the circuit under test.

11. The circuit test method according to claim 10, wherein the configuring the test circuit based on the configuration information comprises:
grouping all circuits under test based on a grouping rule; and configuring, based on a grouping result, a test sub-circuit corresponding to each circuit under test.

12. The circuit test method according to claim 11, wherein the grouping all circuits under test based on a grouping rule comprises:
obtaining a quantity of scan channels in each circuit under test and a bit width of the test bus, wherein the quantity of scan channels in each circuit under test is a maximum value in a quantity of scan input channels and a quantity of scan output channels in each circuit under test; and
grouping all the circuits under test into a plurality of test groups when a sum of quantities of scan channels in all the circuits under test exceeds the bit width of the test bus, wherein a quantity of scan channels in a circuit under test comprised in each test group is less than or equal to the bit width of the test bus.

13. The circuit test method according to claim 11, wherein the configuring, based on a grouping result, a test sub-circuit corresponding to each circuit under test comprises:
connecting all the circuits under test to the test bus by using a data distribution circuit based on the grouping result, determining a correspondence between a scan input channel in the circuit under test and an input of the test bus, and determining a correspondence between a scan output channel in the circuit under test and the output of the test bus, wherein
in a same test group, different scan input channels in the circuit under test correspond to different inputs of the test bus, and different scan output channels in the circuit under test correspond to different outputs of the test bus;
configuring a circuit under test that is not to be tested to a sleep mode by using a configuration module in a test sub-circuit corresponding to the circuit under test that is not to be tested; and/or
configuring a data distribution circuit in the test sub-circuit corresponding to the circuit under test that is not to be tested to a bypass mode by using the configuration module in the test sub-circuit.

14. The circuit test method according to claim 13, wherein in a same test group, when structures of two circuits under test are the same, scan input channels at a same position in the two circuits under test are connected to a same data distribution circuit.

15. The circuit test method according to claim 13, wherein the transmitting the test vector to a scan input channel in the circuit under test by using the test circuit comprises:
transmitting the test vector to the scan input channel in the circuit under test based on the correspondence between the scan input channel in the circuit under test and the input of the test bus by using the input of the test bus corresponding to the scan input channel in the circuit under test.

16. The circuit test method according to claim 13, wherein the transmitting test result data of the circuit under test to an output of the test bus by using the circuit under test comprises:
transmitting, based on the correspondence between the scan output channel in the circuit under test and the output of the test bus, the test result data output by the scan output channel in the circuit under test to the output of the test bus corresponding to the scan output channel in the circuit under test.

17. The circuit test method according to claim 15, wherein the transmitting the test vector to the scan input channel in the circuit under test based on the correspondence between the scan input channel in the circuit under test and the input of the test bus by using the input of the test bus corresponding to the scan input channel in the circuit under test comprises:
sequentially transmitting, by the test bus in a plurality of bus clock cycles, the test vector to scan input channels in the circuit under test that is to be tested, wherein one input of the test bus corresponds to more than one scan input channel in the circuit under test.

18. A test circuit design method, comprising:
obtaining a quantity of scan input channels and a quantity of scan output channels in each circuit under test and a bus bit width of a test bus; and
configuring, on the test bus based on the bus bit width of the test bus and the quantity of scan input channels and the quantity of scan output channels in each circuit under test, a data distribution circuit in a test sub-circuit corresponding to each circuit under test, to generate the test circuit, wherein the test circuit comprises:
a plurality of test sub-circuits respectively corresponding to a plurality of circuits under test, wherein a $j^{th}$ test sub-circuit in the plurality of test sub-circuits comprises $N_j$ data distribution circuits, and the $N_j$ data distribution circuits are configured to connect a corresponding circuit under test to a test bus; and
in the $j^{th}$ test sub-circuit, first input terminals of the $N_j$ data distribution circuits are respectively connected to $N_j$ inputs of the test bus, output terminals of $CI_j$ data distribution circuits in the $N_j$ data distribution circuits are respectively connected to $CI_j$ scan input channels in the circuit under test corresponding to the test sub-circuit, second input terminals of $CO_j$ data distribution circuits in the $N_j$ data distribution circuits are respectively connected to $CO_j$ scan output channels in the circuit under test corresponding to the test sub-circuit, and output terminals of the $N_j$ data distribution circuits are further connected to $N_j$ outputs of the test bus, wherein $N_j = \max(CI_j, CO_j)$, and
a quantity of data distribution circuits in the test sub-circuit corresponding to each circuit under test is determined based on the quantity of scan input channels and the quantity of scan output channels in each circuit under test; and
wherein the $N_j$ data distribution circuits each comprises a first selector and a first register, a first input terminal of the first selector is configured to operate as the first input terminal of the $N_j$ data distribution circuit, a second input terminal of the first selector is configured to operate as the second input terminal of the $N_j$ data distribution circuit, an output terminal of the first selector is connected to an input terminal of the first register, and an output terminal of the first register is configured to operate as the output terminal of the $N_j$ data distribution circuit.

* * * * *